(12) United States Patent
Mikado et al.

(10) Patent No.: US 11,277,923 B2
(45) Date of Patent: Mar. 15, 2022

(54) PRINTED WIRING BOARD AND METHOD FOR MANUFACTURING PRINTED WIRING BOARD

(71) Applicant: IBIDEN CO., LTD., Gifu (JP)

(72) Inventors: Yukinobu Mikado, Ogaki (JP); Tomoaki Shinozuka, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/105,811

(22) Filed: Nov. 27, 2020

(65) Prior Publication Data

US 2021/0176870 A1     Jun. 10, 2021

(30) Foreign Application Priority Data

Dec. 10, 2019    (JP) .............................. JP2019-222582

(51) Int. Cl.
*H05K 1/11*      (2006.01)
*H05K 3/46*      (2006.01)

(52) U.S. Cl.
CPC .......... *H05K 3/4602* (2013.01); *H05K 1/115* (2013.01); *H05K 3/4644* (2013.01); *H05K 2201/0338* (2013.01); *H05K 2201/095* (2013.01)

(58) Field of Classification Search
CPC .................................................. H05K 3/4602
USPC ........................................................ 174/261
See application file for complete search history.

(56) References Cited

U.S. PATENT DOCUMENTS

| 2014/0182912 A1* | 7/2014 | Lin ................... H01L 23/49811 174/261 |
| 2015/0092357 A1* | 4/2015 | Yoshikawa .......... H05K 3/4007 361/746 |
| 2015/0255433 A1* | 9/2015 | Daizo ............... H01L 23/49833 257/737 |
| 2016/0181710 A1* | 6/2016 | Eakins ................. H01R 12/585 174/261 |

FOREIGN PATENT DOCUMENTS

JP          2017-050315 A       3/2017

\* cited by examiner

*Primary Examiner* — Stanley Tso
(74) *Attorney, Agent, or Firm* — Oblon, McClelland, Maier & Neustadt, L.L.P.

(57) ABSTRACT

A printed wiring board includes a conductor layer, an outermost resin insulating layer having a first surface and a second surface on the opposite side with respect to the first surface and laminated on the conductor layer such that the second surface faces the conductor layer, and metal posts formed in the outermost resin insulating layer such that the metal posts are penetrating through the outermost resin insulating layer and reaching the conductor layer. The metal posts include first metal posts and second metal posts such that each of the first metal posts has a first upper surface positioned above the first surface of the outermost resin insulating layer and having an entirely flat surface and that each of the second metal posts has a second upper surface positioned above the first surface of the outermost resin insulating layer and having a partly flat surface.

20 Claims, 4 Drawing Sheets

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2019-222582, filed Dec. 10, 2019, the entire contents of which are incorporated herein by reference.

BACKGROUND OF THE INVENTION

Field of the Invention

The present invention relates to a printed wiring board having metal posts, and a method for manufacturing the printed wiring board having the metal posts.

Description of Background Art

Japanese Patent Application Laid-Open Publication No. 2017-50315 describes a printed wiring board having metal posts. The entire contents of this publication are incorporated herein by reference.

SUMMARY OF THE INVENTION

According to one aspect of the present invention, a printed wiring board includes a conductor layer, an outermost resin insulating layer having a first surface and a second surface on the opposite side with respect to the first surface and laminated on the conductor layer such that the second surface faces the conductor layer, and metal posts formed in the outermost resin insulating layer such that the metal posts are penetrating through the outermost resin insulating layer and reaching the conductor layer. The metal posts include first metal posts and second metal posts such that each of the first metal posts has a first upper surface positioned above the first surface of the outermost resin insulating layer and having an entirely flat surface and that each of the second metal posts has a second upper surface positioned above the first surface of the outermost resin insulating layer and having a partly flat surface.

According to another aspect of the present invention, a method for manufacturing a printed wiring board includes forming a conductor layer, forming on the conductor layer an outermost resin insulating layer having a first surface and a second surface on the opposite side with respect to the first surface such that the second surface of the outermost resin insulating layer faces the conductor layer, forming openings in the outermost resin insulating layer such that the openings penetrate through the outermost resin insulating layer and reach the conductor layer, forming metal posts in the openings formed in the outermost resin insulating layer, respectively, and polishing the metal posts such that a height of each of the metal posts is reduced. The forming of the metal posts includes forming first metal posts and forming second metal posts, and the reducing includes forming the first metal posts such that each of the first metal posts has a first upper surface positioned above the first surface of the outermost resin insulating layer and having an entirely flat surface and forming the second metal posts such that each of the second metal posts has a second upper surface positioned above the first surface of the outermost resin insulating layer and having a partly flat surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
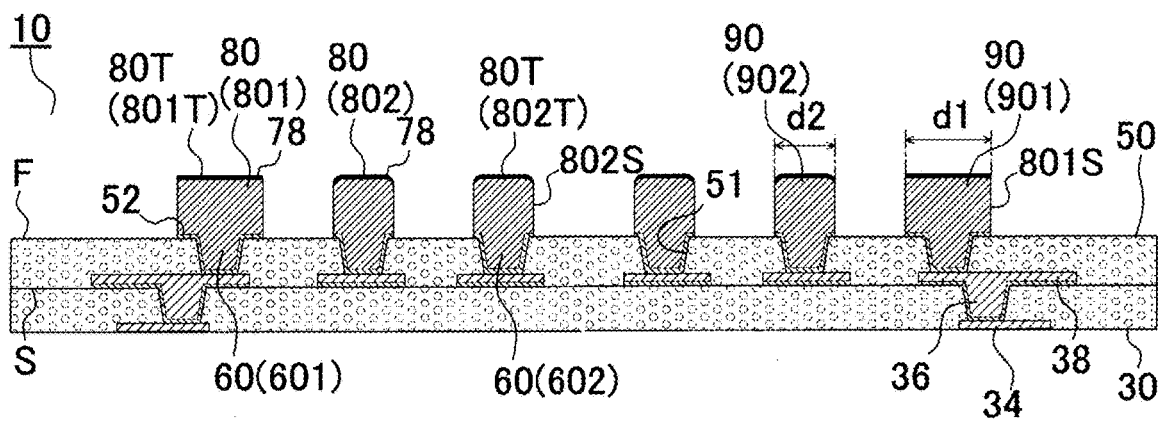
FIG. 1A is a cross-sectional view of a printed wiring board according to an embodiment of the present invention.

Embodiments will now be described with reference to the accompanying drawings, wherein like reference numerals designate corresponding or identical elements throughout the various drawings.

FIG. 1A is a cross-sectional view of a printed wiring board 10 according to an embodiment of the present invention. The printed wiring board 10 includes a conductor layer 38, an outermost resin insulating layer 50 formed on the conductor layer 38, and multiple metal posts 80 that penetrate the outermost resin insulating layer 50 and reach the conductor layer 38. The outermost resin insulating layer 50 has a first surface (F) and a second surface (S) on an opposite side with respect to the first surface (F). The second surface (5) and the conductor layer 38 face each other. The outermost resin insulating layer 50 has openings 51 reaching the conductor layer 38. The metal posts 80 are formed to each include a conductor (via conductor part) 60 formed in an opening 51 and a conductor (protruding part) 90 protruding from the first surface (F) of the outermost resin insulating layer 50. Each of the openings 51 and the via conductor part 60 each have a substantially truncated cone shape. A diameter of each of the openings 51 at the conductor layer 38 is smaller than a diameter of each of the openings 51 at the first surface (F). The protruding part 90 has a substantially cylindrical shape. The via conductor part 60 and the protruding part 90 are continuously integrated.

The via conductor part 60 has a lower surface facing the conductor layer 38 and an upper surface on an opposite side with respect to the lower surface. The upper surface of the via conductor part 60 and the first surface (F) form the same surface. A diameter of the via conductor part 60 is represented by a diameter at the upper surface of the via conductor part 60.

The protruding part 90 has a lower surface facing the upper surface of the via conductor part 60 and an upper surface (80T) on an opposite side with respect to the lower surface. The lower surface of the protruding part 90 and the first surface (F) form the same surface. A diameter of the protruding part 90 is represented by a diameter at the lower surface of the protruding part 90. A diameter (d1 or d2) of each of the metal posts 80 is represented by the diameter of the protruding part 90. The upper surface of the protruding part 90 is positioned above the first surface (F).

The diameter of the protruding part 90 is larger than the diameter of the via conductor part 60. The lower surface of the protruding part 90 completely covers the upper surface of the via conductor part 60. An outer periphery of the lower surface of the protruding part 90 is positioned completely on an outer side of an outer periphery of the upper surface of the via conductor part 60.

The metal posts 80 include first metal posts 801 and second metal posts 802. A via conductor part 60 that forms a first metal post 801 is a first via conductor part 601. A protruding part 90 that foul's a first metal post 801 is a first protruding part 901. The first metal posts 801 are each formed by a first via conductor part 601 and a first protruding part 901 directly connected to the first via conductor part 601. A via conductor part 60 that forms a second metal post 802 is a second via conductor part 602. A protruding part 90 that forms a second metal post 802 is a second protruding part 902. The second metal posts 802 are each formed by a second via conductor part 602 and a second protruding part 902 directly connected to the second via conductor part 602.

A diameter (d1) of each of the first metal posts 801 is larger than a diameter (d2) of each of the second metal posts 802. A diameter of a via conductor part (first via conductor part) 601 forming a first metal post 801 is larger than a diameter of a via conductor part (second via conductor part) 602 forming a second metal post 802.

Figure 4A:
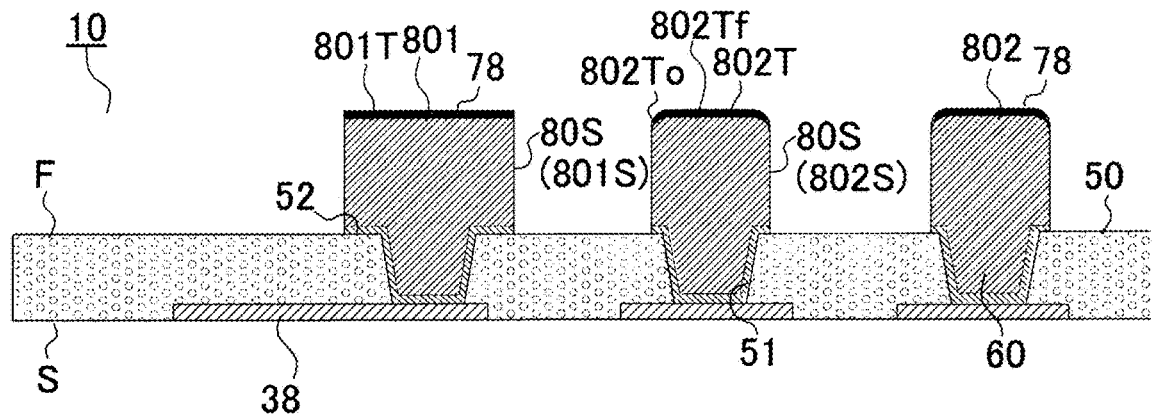
FIG. 4A is an enlarged cross-sectional view of a printed wiring board according to an embodiment of the present invention.
Figure 4B:
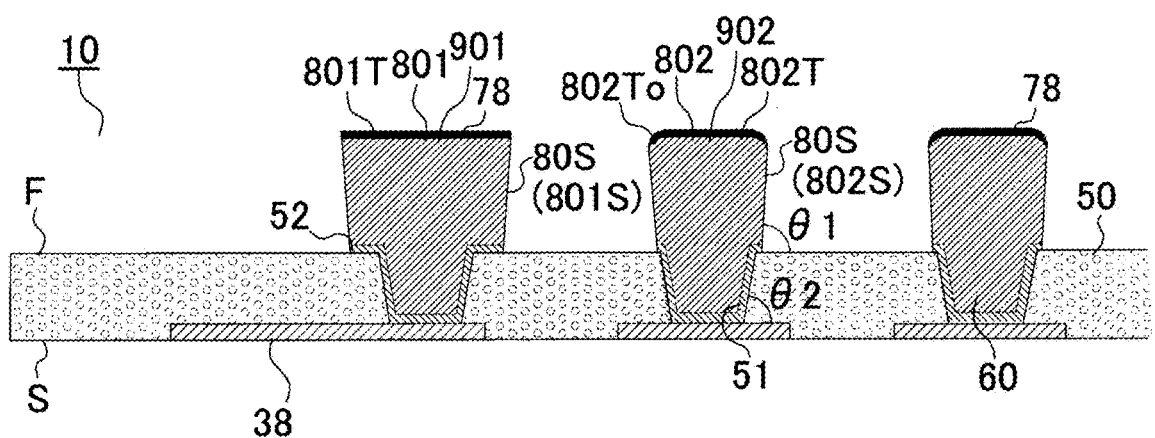
FIG. 4B is an enlarged cross-sectional view of a printed wiring board according to a modified embodiment of the embodiment.
Figure 4C:
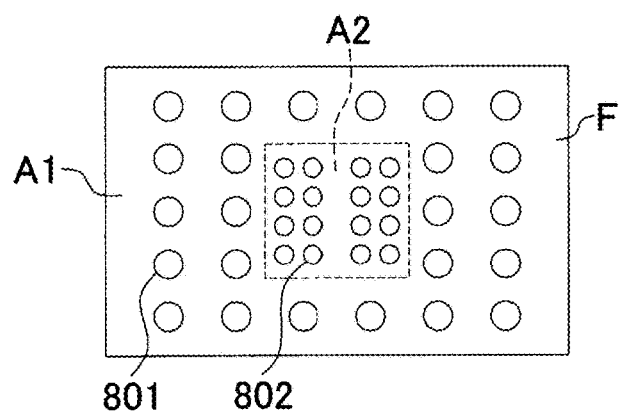
FIG. 4C illustrates a positioning of metal posts.

FIG. 4C illustrates a plan view of the printed wiring board 10. In FIG. 4C, the printed wiring board 10 is observed from a position above the first surface (F). In FIG. 4C, the first surface (F) and the metal posts 80 are depicted. As illustrated in FIG. 4C, the second metal posts 802 are formed within a predetermined area (second metal post area) (A2). An outer periphery of the second metal post area (A2) is depicted using a dotted line. The second metal post area (A2) is formed in a central portion of the printed wiring board 10. The first metal posts 801 are formed outside the second metal post area (A2). The first metal posts 801 are formed in a first metal post area (A1). The first metal post area (A1) surrounds the second metal post area (A2).

An upper surface of a first metal post 801 is a first upper surface (801T). The entire first upper surface (801T) is flat. An upper surface of a second metal post 802 is a second upper surface (802T). A portion of the second upper surface (802T) is flat. The flat portion of the second upper surface (802T) is referred to as a second flat surface (second flat part) (802Tf). The second flat part (802Tf) is formed at a center of the second upper surface (802T).

A metal film 78 is formed on the first upper surface (801T) and on the second upper surface (802T). Examples of the metal film 78 include a tin layer and a Ni/Pd/Au layer.

FIG. 4A is an enlarged cross-sectional view of the printed wiring board of the embodiment. FIG. 4A is obtained by cutting the metal posts 80 along a plane perpendicular to the first upper surface (801T).

Each of the second metal posts 802 has a side surface (802S) extending from the second upper surface (802T). The second upper surface (802T) has a second outer peripheral part (802To) between the second flat part (802Tf) and the side surface (802S). The second outer peripheral part (802To) is downwardly sloped from the second flat part (80210) toward the side surface (802S). As illustrated in FIG. 4A, the second outer peripheral part (802To) is curved. A curved surface that forms the second outer peripheral part (80210) bulges outward.

FIG. 4B is an enlarged cross-sectional view of a printed wiring board according to a modified embodiment of the embodiment. FIG. 4B is obtained by cutting the metal posts 80 along a plane perpendicular to the first upper surface (801T).

In the modified embodiment, side surfaces (801S) of the protruding parts 901 of the first metal posts 801 and the side surfaces (802S) of the protruding parts 902 of the second metal posts 802 taper from the upper surfaces (80T) of the metal posts 80 toward the lower surfaces of the protruding parts 90. Side surfaces of the via conductor parts 601 of the first metal posts 801 and side surfaces of the via conductor parts 602 of the second metal posts 802 taper from the upper surfaces of the via conductor parts 60 toward the lower surfaces of the via conductor parts 60. An angle (81) between the side surface of the protruding part 90 and the lower surface of the protruding part 90 is greater than an angle (82) between the side surface of the via conductor part 60 and the lower surface of the via conductor part 60. The angles (81, 82) are illustrated in FIG. 4B. In this case, the protruding parts each have a substantially cylindrical shape. A ratio of the diameter of the upper surface of the protruding part to the diameter of the lower surface of the protruding part ((diameter of the upper surface)/(diameter of the lower surface)) is preferably 1.1 or less.

In the modified embodiment, the second outer peripheral part (802To) of each of the second metal posts 802 bulges outward.

Figure 1B:
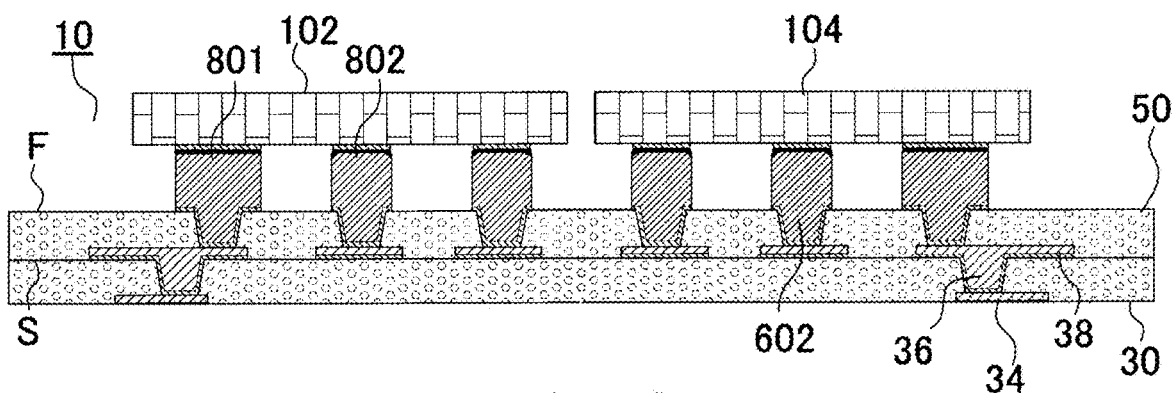
FIG. 1B is a cross-sectional view of an application example of the printed wiring board according to the embodiment.

FIG. 1B is a cross-sectional view of an application example of the printed wiring board according to the embodiment. A first electronic component 102 and a second electronic component 104 are mounted on the printed wiring board 10. The first electronic component 102 and the second electronic component 104 are mounted on the printed wiring board 10 via the metal posts 80.

Figure 1C:
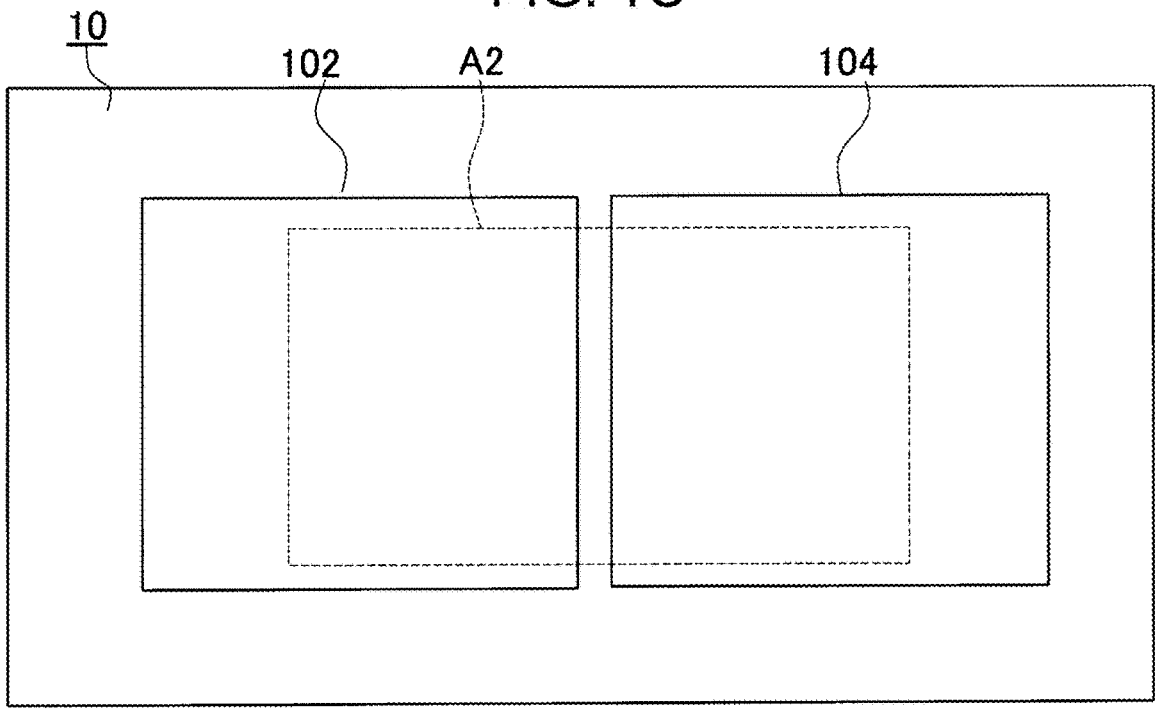
FIG. 1C is a plan view of the application example of the printed wiring board according to the embodiment.

FIG. 1C is a plan view of the application example of the printed wiring board according to the embodiment. The second metal post area (A2) is depicted in FIG. 1C.

Data transmission between the first electronic component 102 and the second electronic component 104 is performed via the second metal posts 802 connected to the first electronic component 102 and the second metal posts 802 connected to the second electronic component 104. Power is supplied to the first electronic component 102 and the second electronic component 104 via the first metal posts 801. The first electronic component 102 and the second electronic component 104 are connected to the ground via the first metal posts 801.

In the printed wiring board 10 of the embodiment or the modified embodiment, the entire first upper surface (801T) of each of the first metal posts 801 is flat. A portion of the second upper surface (802T) of each of the second metal posts 802 is flat. That is, in the embodiment and the modified embodiment, polishing is not performed to an extent that the upper surfaces of all the metal posts become completely flat. A polishing time period is shortened. A stress stored in the metal posts during polishing can be reduced. A manufacturing cost can be reduced. Reliability of the metal posts can be increased. Since a part of the second upper surface (802T) of each of the second metal posts 802 is flat, the reliability of the second metal posts 802 is unlikely to decrease. When the diameter of each of the second metal posts 802 is smaller than the diameter of each of the first metal posts 801, the reliability via the second metal posts 802 is lower than the reliability via the first metal posts 801. However, the second upper surface (802T) of each of the second metal posts 802 is partially flat. Therefore, a stress in each of the second metal posts 802 is smaller in magnitude than a stress in each of the first metal posts 801. Therefore, even when the diameter (d2) of each of the second metal posts 802 is smaller than the diameter (d1) of each of the first metal posts 801, the reliabilities of the two are substantially the same. Since one of the first metal posts 801 and the second metal posts 802 does not deteriorate in a short time period, the reliability of the printed wiring board having the first metal posts 801 and the second metal posts 802 is stable over a long time period.

When the second metal posts 802 each have the second outer peripheral part (802To), an area of the second upper surface (802T) can be increased. Therefore, even when the metal film 78 is formed on the second upper surface (802T), adhesion between the second upper surface (802T) and the metal film 78 can be increased. Even when a bump is formed on the second upper surface (802T), adhesion between the second upper surface (802T) and the bump can be increased. Since the second metal posts 802 each have the second outer peripheral part (802To), even when the metal posts 80 having different diameters are present in the printed wiring board, reliability via the metal posts 80 is stable over a long time period.

Manufacturing Method

FIGS. 2A-2D and 3A-3D illustrate a method for manufacturing the printed wiring board 10 of the embodiment.

Figure 2A:
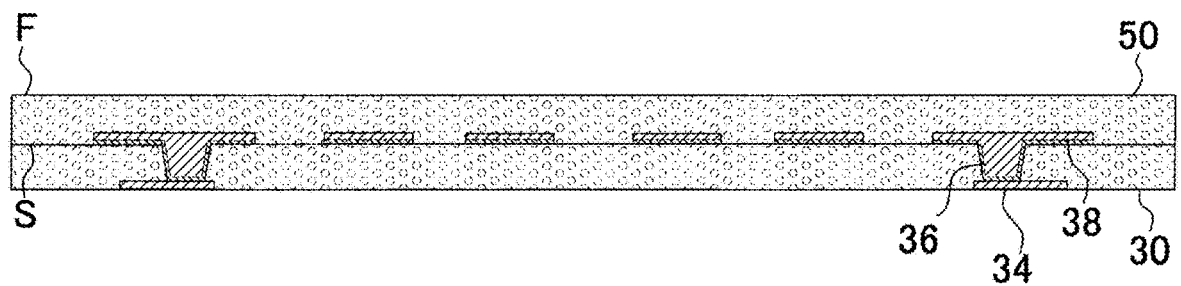
FIGS. 2A-2D are manufacturing process diagrams of a printed wiring board according to an embodiment of the present invention.
Figure 2B:
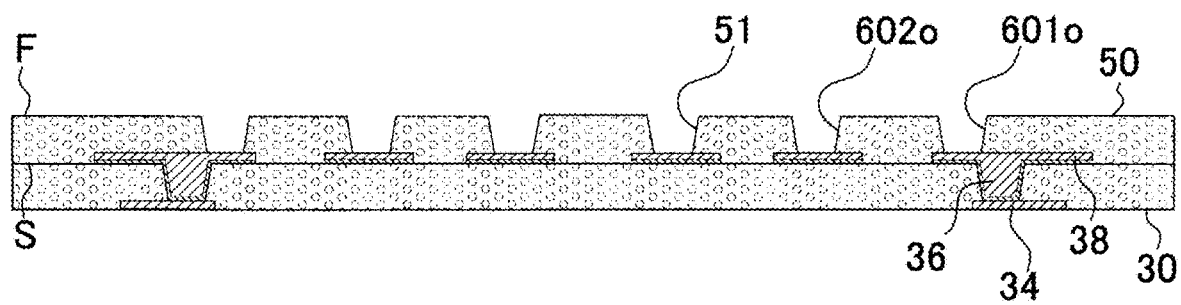
Figure 2C:
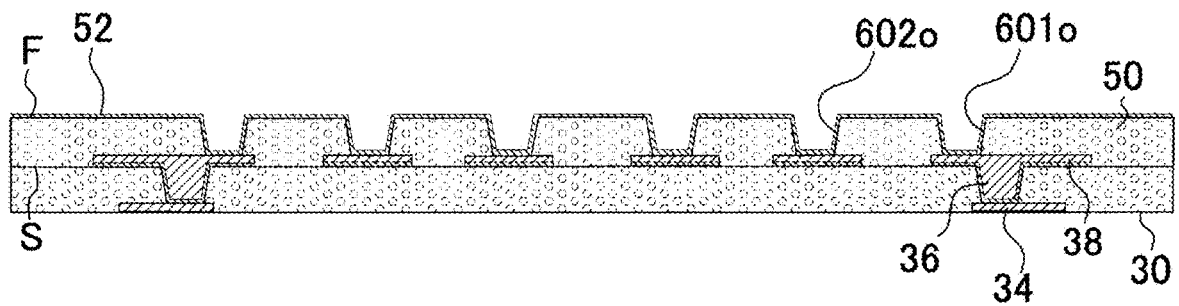

A resin insulating layer 30 is formed on a first conductor layer 34. A conductor layer 38 is formed on the resin insulating layer 30. In this case, via conductors 36 that penetrate the resin insulating layer 30 and reach the first conductor layer 34 are formed. An outermost resin insulating layer 50 is formed on the resin insulating layer 30 and the conductor layer 38 (FIG. 2A). The outermost resin insulating layer 50 has a first surface (F) and a second surface (S) on an opposite side with respect to the first surface (F). The outermost resin insulating layer 50 is formed such that the second surface (S) and the conductor layer 38 face each other. Openings 51 reaching the conductor layer 38 are formed in the outermost resin insulating layer 50 using laser (FIG. 2B). The openings 51 include first openings (601o) for first via conductor parts 601 and second openings (602o) for second via conductor parts 602. A diameter of each of the first openings (601o) is larger than a diameter of each of the second openings (602o). The diameters of the first openings (601o) and the second openings (602o) are measured on the first surface (F). An electroless plating film (seed layer) 52 is formed on the first surface (F) of the outermost resin insulating layer 50 and in the openings 51 (FIG. 2C).

Figure 2D:
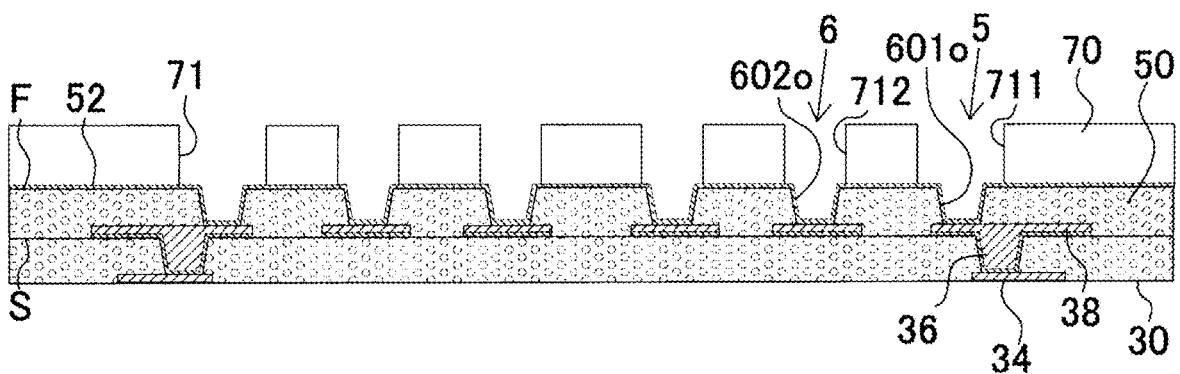
Figure 3A:
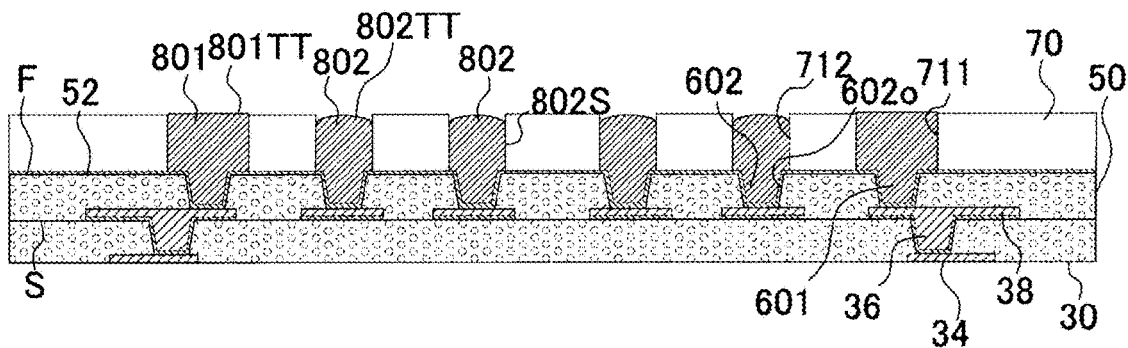
FIGS. 3A-3D are manufacturing process diagrams of a printed wiring board according to the embodiment.

A plating resist 70 having openings 71 is formed on the seed layer 52 (FIG. 2D). The openings 71 include third openings 711 for first protruding parts 901 and fourth openings 712 for second protruding parts 902. A diameter of each of the third openings 711 is larger than a diameter of each of the fourth openings 712. The diameters of the third openings 711 and the fourth openings 712 are measured on the first surface (F). The third openings 711 are respectively connected to the first openings (601o). The diameter of each of the third openings 711 is larger than the diameter of each of the first openings (601o). Fifth openings 5 for first metal posts 801 are formed by the third openings 711 and the first openings (601o). A diameter of each of the fifth openings 5 is represented by the diameter of each of the third openings 711. The fourth openings 712 are respectively connected to the second openings (602o). The diameter of each of the fourth openings 712 is larger than the diameter of each of the second openings (602o). Sixth openings 6 for second metal posts 802 are formed by the fourth openings 712 and the second openings (602o). A diameter of each of the sixth openings 6 is represented by the diameter of each of the fourth openings 712. The first metal posts 801 are respectively formed in the fifth openings 5 by using the electroless plating film 52 as a seed layer. The second metal posts 802 are respectively formed in the sixth openings 6 (FIG. 3A). FIG. 3A illustrates an example of cross-sectional shapes of the top parts (801TT) of the first metal posts 801 and top parts (802TT) of the second metal posts 802. The top parts are surfaces exposed by the openings 71. Since the diameter of each of the fifth openings 5 is larger than the diameter of each of the sixth openings 6, a plating growth rate in the fifth openings 5 tends to be higher than a plating growth rate in the sixth openings 6. For example, a circulation speed of a plating solution differs between the two. Therefore, the top parts (801TT) of the first metal posts 801 are substantially flat, and the top parts (802TT) of the second metal posts 802 are bulging. A center of the top part (802TT) of each of the second metal posts 802 is high. Or, the first metal posts 801 are higher than the second metal posts 802. And, the top parts (802TT) of the second metal posts 802 are bulging. The top parts (801TT) of the first metal posts 801 are flat. Or, the top parts (801TT) of the first metal posts 801 are recessed. Or, the top parts (801TT) of the first metal posts 801 are bulging. An apex of the top part (802TT) of each of the second metal posts 802 is lower than a lowest point of the top part (801TT) of each of the first metal posts 801.

Figure 3B:
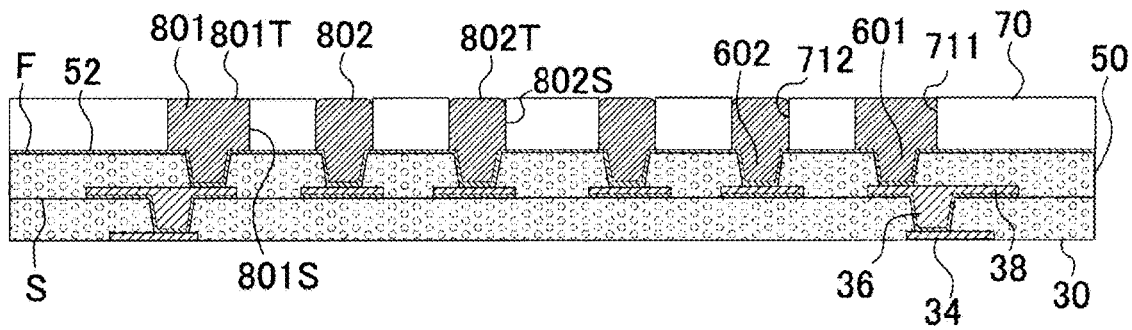

The plating resist 70 and the metal posts 80 are polished. The plating resist 70 is reduced in thickness. The metal posts 80 are reduced in height. By the polishing, upper surfaces (80T) of the metal posts 80 are formed. The first metal posts 801 each having a flat first upper surface (801T) are formed. The second metal posts 802 each having a partially flat second upper surface (802T) are formed (FIG. 3B). Only a center part of the second upper surface (802T) is flat. As illustrated in FIG. 4A, a second outer peripheral part (802To) is formed around a second flat part (802Tf). The second outer peripheral part (802To) is not polished. The second outer peripheral part (802To) is downwardly sloped from the second flat part (802Tf) toward the side surface (802S).

Figure 3C:
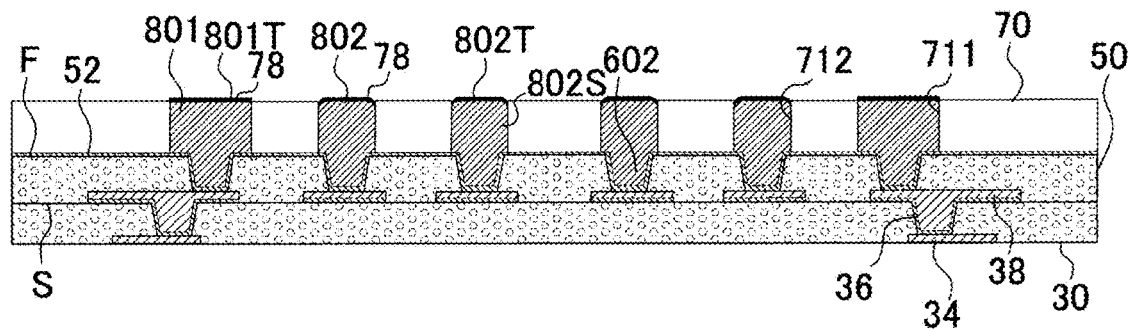
Figure 3D:
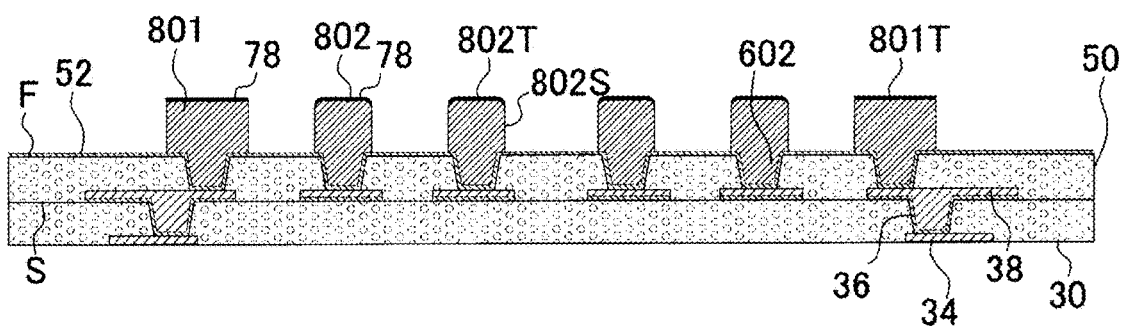

A metal film 78 is formed on the first upper surfaces (801T) of the first metal posts 801 and the second upper surfaces (802T) of the second metal posts 802 exposed from the plating resist 70 (FIG. 3C). The plating resist 70 is removed (FIG. 3D). The electroless plating film 52 exposed from the first metal posts 801 and the second metal posts 802 is removed by etching. The printed wiring board 10 is completed (FIG. 1A). By adjusting an etching condition for removing the electroless plating film 52, the first metal posts 801 and the second metal posts 802 according to the modified embodiment of the embodiment illustrated in FIG. 4B can be formed. In the modified embodiment of the embodiment, the side surfaces (801S) of the first metal posts 801 and the side surfaces (802S) of the second metal posts 802 each have a tapered shape such that the protruding parts taper toward the first surface (F).

The first electronic component 102 and the second electronic component 104 are mounted on the printed wiring board 10 (FIG. 1B).

In the method for manufacturing the printed wiring board 10 of the embodiment, polishing is not performed to an extent that the upper surfaces of all the metal posts become completely flat. A polishing time period is shortened. A stress stored in the metal posts during polishing can be reduced. A manufacturing cost can be reduced. Reliability of the metal posts can be increased. The metal film 78 is formed on the upper surfaces (80T) of the metal posts 80 when the plating resist 70 is present. Therefore, the metal film 78 can be formed only on the upper surfaces (80T). The metal film 78 is not formed on the side surfaces (80S) of the metal posts. Insulation reliability between adjacent metal posts 80 can be increased.

The printed wiring board of the embodiment can have three or more resin insulating layers or a core substrate.

In Japanese Patent Application Laid-Open Publication No. 2017-50315, a plating resist having openings for forming metal posts is formed on a conductor layer. The metal posts are formed by plating in the openings. The plating resist is removed. The metal posts are embedded in an insulating layer. Surfaces of the metal posts and the insulation layer are polished. As a result, top parts of all the metal posts are flattened. Heights of the metal posts are equalized.

In Japanese Patent Application Laid-Open Publication No. 2017-50315, the metal posts are polished so that the top parts of all the metal posts are flattened. A long time period is required for the polishing. Since the top parts of all the metal posts are flat, it is thought that excessive polishing is performed. It is thought that a stress is accumulated in the metal posts during the polishing. It is thought that, due to the stress, reliability of the metal posts is decreased.

A printed wiring board according to an embodiment of the present invention includes: a conductor layer; an outermost resin insulating layer that has a first surface and a second surface on an opposite side with respect to the first surface and is laminated on the conductor layer such that the second surface faces the conductor layer; and multiple metal posts that penetrate the outermost resin insulating layer and reach the conductor layer. The metal posts include multiple first metal posts that each have a first upper surface and multiple second metal posts that each have a second upper surface. The first upper surface and the second upper surface are positioned above the first surface. The entire first upper surface is flat, and a part of the second upper surface is flat.

A method for manufacturing a printed wiring board according to an embodiment of the present invention includes: forming a conductor layer; forming an outermost resin insulating layer, which has a first surface and a second surface on an opposite side with respect to the first surface, on the conductor layer such that the second surface faces the conductor layer; forming multiple openings that penetrate the outermost resin insulating layer and reach the conductor layer; forming metal posts in the openings, respectively; and reducing a height of each of the metal posts by polishing. The forming of the metal posts includes forming multiple first metal posts and forming multiple second metal posts. The reducing includes forming the first metal posts each having a first upper surface and the second metal posts each having a second upper surface. The first upper surface and the second upper surface are positioned above the first surface. The entire first upper surface is flat, and a part of the second upper surface is flat.

According to an embodiment of the present invention, the entire first upper surface of each of the first metal posts is flat. A part of the second upper surface of each of the second metal posts is flat. That is, in the embodiment, polishing is not performed to an extent that the upper surfaces of all the metal posts become completely flat. A polishing time period is shortened. A stress stored in the metal posts during polishing can be reduced. A manufacturing cost can be reduced. Reliability of the metal posts can be increased. Since a part of the second upper surface of each of the second metal posts is flat, the reliability of the second metal posts is unlikely to decrease. When the diameter of each of the second metal posts is smaller than the diameter of each of the first metal posts, the reliability via the second metal posts is lower than the reliability via the first metal posts. However, since a part of the second upper surface of each of the second metal posts is flat, a stress in each of the second metal posts is smaller in magnitude than a stress in each of the first metal posts. Therefore, even when the diameter of each of the second metal posts is smaller than the diameter of each of the first metal posts, the reliabilities of the two are substantially the same. Since one of the first metal posts and the second metal posts does not deteriorate in a short time period, the reliability of the printed wiring board having the first metal posts and the second metal posts is stable over a long time period.

When the second metal posts each have the second outer peripheral part, an area of the second upper surface can be increased. Therefore, even when a metal film is formed on the second upper surface, adhesion between the second upper surface and the metal film can be increased. Even when a bump is formed on the second upper surface, adhesion between the second upper surface and the bump can be increased. Since the second metal posts each have the second outer peripheral part, even when the metal posts having different diameters are present in the printed wiring board, reliability via the metal posts is stable over a long time period.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a conductor layer;
   an outermost resin insulating layer having a first surface and a second surface on an opposite side with respect to the first surface and laminated on the conductor layer such that the second surface faces the conductor layer;
   a plurality of metal posts formed in the outermost resin insulating layer such that the plurality of metal posts is penetrating through the outermost resin insulating layer and reaching the conductor layer; and
   a plurality of metal films formed on the plurality of metal posts respectively such that each of the metal films is formed on a respective one of a first upper surface of the first metal posts and a second upper surface of the second metal posts,
   wherein the plurality of metal posts includes a plurality of first metal posts and a plurality of second metal posts such that each of the first metal posts has the first upper surface positioned above the first surface of the outermost resin insulating layer and having an entirely flat surface and that each of the second metal posts has the second upper surface positioned above the first surface of the outermost resin insulating layer and having a partly flat surface,
   the plurality of metal posts is formed such that each of the second metal posts has a side surface extending from the second upper surface and that the second upper surface of each of the second metal posts includes a flat portion and an outer peripheral portion formed between the flat portion and the side surface and downwardly sloping from the flat portion toward the side surface, the plurality of second metal posts is formed such that the outer peripheral portion of the second upper surface is curved and bulging outward, and the plurality of metal posts is formed such that each of the metal posts has a protruding portion and a via conductor portion and that an angle θ1 between a side surface of the protruding portion and a lower surface of the protruding portion is greater than an angle θ2 between a side surface of the via conductor portion and a lower surface of the via conductor portion.

2. The printed wiring board according to claim 1, wherein the plurality of metal posts is formed such that a diameter of each of the first metal posts is larger than a diameter of each of the second metal posts.

3. The printed wiring board according to claim 2, wherein the plurality of metal posts is formed such that the plurality of second metal posts is formed in a predetermined area and that the plurality of first metal posts is formed outside the predetermined area.

4. The printed wiring board according to claim 3, wherein the plurality of metal films is formed such that each of the metal films includes one of a tin layer and a Ni/Pd/Au layer.

5. The printed wiring board according to claim 3, wherein the plurality of metal posts is formed such that the side surface of the protruding portion is tapering toward the lower surface of the protruding portion.

6. The printed wiring board according to claim 2, wherein the plurality of metal films is formed such that each of the metal films includes one of a tin layer and a Ni/Pd/Au layer.

7. The printed wiring board according to claim 2, wherein the plurality of metal posts is formed such that the side surface of the protruding portion is tapering toward the lower surface of the protruding portion.

8. The printed wiring board according to claim 2, wherein the plurality of metal posts is formed such that the protruding portion has a cylindrical shape.

9. The printed wiring board according to claim 2, wherein the plurality of metal posts is formed such that a ratio of a diameter of an upper surface of the protruding portion to a diameter of the lower surface of the protruding portion is 1.1 or less.

10. The printed wiring board according to claim 1, wherein the plurality of metal posts is formed such that the plurality of second metal posts is formed in a predetermined area and that the plurality of first metal posts is formed outside the predetermined area.

11. The printed wiring board according to claim 10, wherein the plurality of metal films is formed such that each of the metal films includes one of a tin layer and a Ni/Pd/Au layer.

12. The printed wiring board according to claim 10, wherein the plurality of metal posts is formed such that the side surface of the protruding portion is tapering toward the lower surface of the protruding portion.

13. The printed wiring board according to claim 10, wherein the plurality of metal posts is formed such that the protruding portion has a cylindrical shape.

14. The printed wiring board according to claim 10, wherein the plurality of metal posts is formed such that a ratio of a diameter of an upper surface of the protruding portion to a diameter of the lower surface of the protruding portion is 1.1 or less.

15. The printed wiring board according to claim 1, wherein the plurality of metal films is formed such that each of the metal films includes one of a tin layer and a Ni/Pd/Au layer.

16. The printed wiring board according to claim 1, wherein the plurality of metal posts is formed such that the side surface of the protruding portion is tapering toward the lower surface of the protruding portion.

17. The printed wiring board according to claim 1, wherein the plurality of metal posts is formed such that the protruding portion has a cylindrical shape.

18. The printed wiring board according to claim 1, wherein the plurality of metal posts is formed such that a ratio of a diameter of an upper surface of the protruding portion to a diameter of the lower surface of the protruding portion is 1.1 or less.

19. A method for manufacturing a printed wiring board, comprising:

forming a conductor layer;

forming on the conductor layer an outermost resin insulating layer having a first surface and a second surface on an opposite side with respect to the first surface such that the second surface of the outermost resin insulating layer faces the conductor layer;

forming a plurality of openings in the outermost resin insulating layer such that the plurality of openings penetrates through the outermost resin insulating layer and reaches the conductor layer;

forming a plurality of metal posts in the plurality of openings formed in the outermost resin insulating layer, respectively;

polishing the plurality of metal posts such that a height of each of the metal posts is reduced, and forming a plurality of metal films on the plurality of metal posts respectively such that each of the metal films is formed on a respective one of a first upper surface of the first metal posts and a second upper surface of the second metal posts, wherein the forming of the metal posts includes forming a plurality of first metal posts and forming a plurality of second metal posts, and the reducing includes forming the plurality of first metal posts such that each of the first metal posts has the first upper surface positioned above the first surface of the outermost resin insulating layer and having an entirely flat surface and forming the plurality of second metal posts such that each of the second metal posts has the second upper surface positioned above the first surface of the outermost resin insulating layer and having a partly flat surface, the plurality of metal posts is formed such that each of the second metal posts has a side surface extending from the second upper surface and that the second upper surface of each of the second metal posts includes a flat portion and an outer peripheral portion formed between the flat portion and the side surface and downwardly sloping from the flat portion toward the side surface, the plurality of second metal posts is formed such that the outer peripheral portion of the second upper surface is curved and bulging outward, and the plurality of metal posts is formed such that each of the metal posts has a protruding portion and a via conductor portion and that an angle θ1 between a side surface of the protruding portion and a lower surface of the protruding portion is greater than an angle θ2 between a side surface of the via conductor portion and a lower surface of the via conductor portion.

20. The method for manufacturing a printed wiring board according to claim 19, wherein the plurality of metal posts is formed such that a diameter of each of the first metal posts is larger than a diameter of each of the second metal posts.

\* \* \* \* \*